United States Patent [19]

Chang

[11] Patent Number: 5,712,195

[45] Date of Patent: Jan. 27, 1998

[54] METHOD FOR MAKING VIA STRUCTURE WITH METALLIC SPACER

[75] Inventor: Kuang-Yeh Chang, Los Gatos, Calif.

[73] Assignee: VLSI Technology, Inc., San Jose, Calif.

[21] Appl. No.: 712,573

[22] Filed: Sep. 12, 1996

Related U.S. Application Data

[63] Continuation of Ser. No. 485,809, Jun. 7, 1995, abandoned, which is a continuation of Ser. No. 335,306, Nov. 7, 1994, Pat. No. 4,493,152, which is a continuation of Ser. No. 153,932, Nov. 9, 1993, abandoned.

[51] Int. Cl.$^6$ ............................................ H01L 21/28
[52] U.S. Cl. ..................... 437/195; 437/190; 437/192; 437/978; 437/981
[58] Field of Search ................................ 437/190, 192, 437/195, 981, 947, 231, 278

[56] References Cited

U.S. PATENT DOCUMENTS

| | | | |
|---|---|---|---|
| 4,666,737 | 5/1987 | Gimpelson et al. | 437/192 |
| 4,712,125 | 12/1987 | Bhatia et al. | 357/59 |
| 4,962,414 | 10/1990 | Liou et al. | 357/71 |
| 4,963,511 | 10/1990 | Smith | 437/200 |
| 5,093,710 | 3/1992 | Higuchi | 357/71 |
| 5,196,724 | 3/1993 | Gordon et al. | 257/530 |
| 5,243,220 | 9/1993 | Shibata et al. | 257/748 |
| 5,281,850 | 1/1994 | Kanamori | 257/758 |
| 5,294,836 | 3/1994 | Kishi | 257/750 |
| 5,399,530 | 3/1995 | Kenmatsu | 437/195 |
| 5,444,019 | 8/1995 | Chen et al. | 437/192 |

FOREIGN PATENT DOCUMENTS

| 2-32544 | 2/1990 | Japan | 257/767 |
|---|---|---|---|

*Primary Examiner*—John Niebling
*Assistant Examiner*—Thomas G. Bilodeau
*Attorney, Agent, or Firm*—Hickman Beyer & Weaver

[57] ABSTRACT

A conductive via structure establishes an electrical interconnection between two conductive layers in a semiconductor structure by connecting a first conductive layer on a semiconductor substrate to a second conductive layer by means of a conductive via structure extending through a non-conductive layer separating the two conductive layers. The non-conductive layer preferably includes a layer of spin-on-glass (SOG), and is provided with a via aperture therethrough. A conductive spacer, preferably of TiW, is fabricated within the via aperture in abutment with the walls of the via aperture. A second conductive layer is fabricated over the non-conductive layer, the conductive spacer, and within the via aperture, to establish the completed electrical interconnection. The via structure reduces out-gassing and chipping from the SOG layer, yet provides a low electrical resistance path between the two conductive layers.

4 Claims, 4 Drawing Sheets

METHOD FOR MAKING VIA STRUCTURE WITH METALLIC SPACER

The present application is a continuation of U.S. patent application Ser. No. 08/485,809, filed Jun. 7, 1995, now abandoned, which is a continuation of U.S. patent application Ser. No. 08/335,306, filed Nov. 7, 1994, now U.S. Pat. No. 5,493,152, which is a continuation of U.S. patent application Ser. No. 08/153,932, filed Nov. 9, 1993, now abandoned.

BACKGROUND OF THE INVENTION

This invention relates generally to semiconductor processing, and more particularly to the establishment of effective electrical interconnections through apertures extending through a dielectric layer separating two conductive layers of a semiconductor structure.

The manufacture of semiconductor devices having multiple, substantially parallel conductive layers of patterned electrical circuitry requires the effective interconnection of these layers with electrically conductive columns or vias. These vias are constructed in a variety of ways according to the prior art. In general, a via is fabricated in an aperture formed through a dielectric layer separating two electrically conductive layers. The electrically conductive layers themselves are usually metal (e.g., aluminum) in order to ensure effective conduction of electric current or, as the case may be, the storage of electric charge.

Fabrication of a multilayer, interconnected semiconductor structure typically includes the fabrication or deposition of a selected first conductive layer of a desired electrically conductive material on a prepared semiconductor substrate, such as a silicon wafer provided with an insulating oxide layer. Substrates of other semiconductor materials such as gallium arsenide, and a variety of other of well-known semiconducting materials, can be used as well.

One example of a known approach for the construction of a semiconductor structure is shown in FIG. 1. The structure shown in FIG. 1 illustrates a semiconductor structure 1 including a substrate 2 such a silicon wafer W with an oxide layer 4. Deposited over the substrate 2 are first and second conductive layers 6 and 8. First conductive layer 6 is deposited on the substrate 2 over oxide layer 4. Additionally, semiconductor structure 1 includes a non-conductive layer structure 10 which is fabricated directly on first conductive layer 6 according to well known semiconductor processing techniques.

Non-conductive layer structure 10 may be constructed as a composite structure comprising multiple layers. Alternatively, layer structure 10 could comprise a single dielectric or non-conductive layer. In the case shown in FIG. 1, the composite structure of non-conductive layer structure 10 comprises three layers, respectively 12, 14, and 16. Of these, layers 12 and 16 are considered to be the outer layers and layer 14 is considered to be the inner layer. Outer layers 12 and 16 of non-conductive layer structure 10 are, for example, fabricated according to well known plasma enhanced chemical vapor deposition (PECVD) techniques, as silicon dioxide ($SiO_2$) layers. Inner layer 14, on the other hand, is preferably created according to a spin-on-glass (SOG) technique known to those skilled in the art of semiconductor fabrication.

SOG material is problematic during and after fabrication, because of its liquid phase at the beginning of fabrication. Inner layer 14 accordingly requires curing, but it nonetheless tends to retain moisture. Even after curing operation has been completed, inner layer 14 is prone to shrinkage, cracking, and chipping, which can cause reliability problems in semiconductor structure 1. Furthermore, inner layer 14 of non-conductive layer structure 10 out-gases oxygen, nitrogen, and other gases over a considerable period of time, due to its intrinsic compound properties.

As noted, non-conductive layer structure 10 separates first and second conductive layers 6 and 8. In order to permit electrical communication between conductive layers 6 and 8, an aperture or "via hole" 18 is defined in non-conductive layer structure 10 according to well known techniques. To address the problems noted with respect to SOG in inner layer 14 of non-conductive layer structure 10, one approach of the prior art is to seal the exposed edges of inner layer 14 which were exposed by the creation of aperture 18 by means of a dielectric spacer 20, made of nitride, for example, to seal the inner surfaces of aperture 18 and to prevent out-gassing effects from SOG layer 14. Furthermore, by sealing the edges of non-conductive layer structure 10 in via aperture 18, any chipping in the structure of inner layer 14 is effectively isolated.

Unfortunately, the result of inserting dielectric spacer 20 is to reduce the effective width, "$W_E$," of aperture 18, and therefore the actual width of via V, which serves as the electric current path from first conductive layer 6 to second conductive layer 8. This reduced width is disadvantageous, because either the electrical resistance of the via within aperture 18 is increased, or the overall design of semiconductor layer structure 10 has to be modified provide for a larger dimension aperture 18. Such a larger aperture 18 would, of course, reduce the density of devices that could be manufactured on an integrated circuit chip.

SUMMARY OF THE INVENTION

According to the invention, a via is provided which prevents out-gassing and reduces the chipping problem of SOG inner layers of a non-conductive layer structure. The via preferably includes a titanium tungsten (TiW) spacer element against the edges of the non-conductive layer structures through which the via aperture has been fabricated. By establishing such a conductive TiW spacer element within the via aperture, it is possible to establish an electrical interconnection of substantially undiminished conductance between the conductive layers without sacrificing additional semiconductor chip geometry.

The method of the invention includes depositing dielectric material in one or more non-conductive layers, upon a first selected layer of conductive material. Next, an opening or via aperture is created at a selected location in the non-conductive layer, effective for exposing a portion of the first layer of conductive material. This causes inner portions of the non-conductive layer to be exposed at the via aperture. Next, conductive spacers are formed in the via aperture to seal the exposed inner portions of the non-conductive layer. Finally, a second metal layer is formed over the non-conductive layer and within the via aperture to complete the formation of the conductive via. This results in a semiconductor structure in which the effective electrical dimensions of the via aperture through the non-conductive layer are maintained without reduction. Additionally, the structural integrity of the edges of dielectric layer in the vicinity of the via aperture is maintained.

The arrangement according to the invention is further directed toward enabling the establishment of an effective electrical interconnection in a semiconductor structure, including a semiconductor substrate and a first layer of conductive material fabricated on said semiconductor substrate. The arrangement includes a non-conductive layer of selected non-conductive material deposited upon the first layer of conductive material. The non-conductive layer defines an opening of predetermined lateral dimensions at a selected location of the non-conductive layer material, for exposing a portion of said first layer of conductive material and defining a vertical path through the non-conductive layer which causes selected inner portions of the non-conductive layer to be exposed. The arrangement includes a layer of titanium tungsten (TiW) deposited over the non-conductive layer material and within the opening. The TiW is then processed to form conductive spacers within the opening. Finally, a conductive layer of, for example, aluminum is formed over the non-conductive layer and within the opening.

The invention advantageously provides for the improved fabrication of semiconductor structures having multiple conductive layers. The quality of the multilayer conductive devices is enhanced by the increased structural integrity of layers in the neighborhood of a via aperture fabricated to establish interconnections between two metallic layers. Particularly avoided is the pulling back, cracking, chipping, and out-gassing in the via apertures that tends to occur in prior art devices having a spin-on-glass layer in the dielectric separating the two metal layers.

The present invention also advantageously provides a conductive via structure with conductive spacers capable of being manufactured with small dimensions yet having a reduced resistivity compared to via structures of the prior art that were manufactured with dielectric spacers.

These and other advantages of the present invention will become apparent upon reading the following detailed descriptions and studying the various figures of the drawings.

DETAILED DESCRIPTION OF THE PREFERRED EMBODIMENTS

Figure 2A:
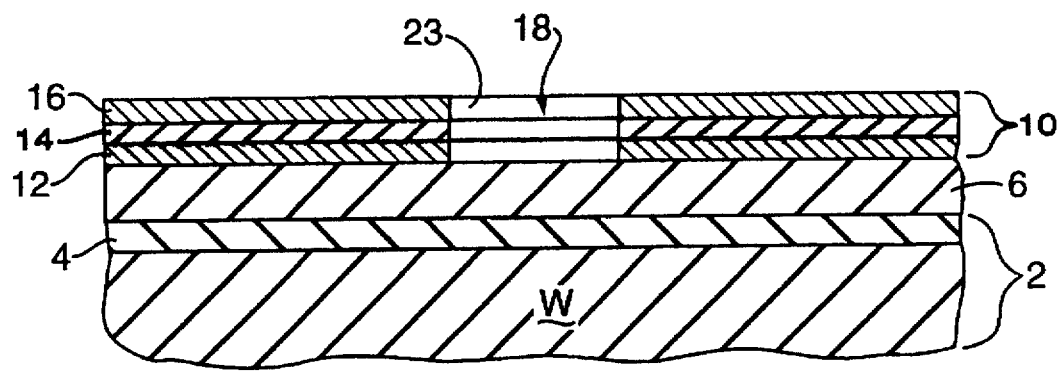
FIG. 2a shows, in partial cross section, a basic semiconductor structure including substrate, conductive layer, and non-conductive layer provided with a via aperture, serving as a structural environment in which the invention operates.

FIG. 2a illustrates an implementation of the invention herein, including a semiconductor structure 1 in turn including a semiconductor substrate 2 including a semiconductor (preferably silicon) wafer W covered with an insulating (preferably $SiO_2$) layer 4, a conductive layer 6 (preferably aluminum), and a multi-layer, non-conductive layer structure 10. Wafer W is a semiconductor wafer made from a material such as silicon or gallium arsenide, for example, and is covered with oxide layer 4 to insulate conductive layer 6 from wafer W. Conductive layer 6 can be fabricated according to a number of well-known conventional techniques. By way of an example and as one preferred embodiment, the first conductive layer 6 is deposited by sputter deposition of titanium tungsten, followed by sputter deposition of aluminum or AlCu (for example, at a ratio of approximately 99:1), followed by, a sputter deposition of titanium tungsten over the AlCu. Alternatively, layer 6 can simply be a deposited Al layer. Conductive layer 6 is then patterned into conductive lines, as is well known to those skilled in the art. As used herein, the term "patterned" refers to photolithographic techniques, whereby a resist material is applied to the upper surface of layer 6, is exposed to a pattern of radiant energy, and is then developed to form a mask. An etching process is undertaken to etch away the surface of the layer 6 through the mask. At the end of the photolithography process, the mask is typically removed.

Semiconductor structure 1 of FIG. 2a includes a dielectric or non-conductive layer structure 10 fabricated over conductive layer 6. As used herein the terms "dielectric" and "non-conductive" will be used interchangeably to indicate materials or layers with very high resistance, e.g. having a resistivity greater than about 1 gigaohms-cm. Non-conductive layer structure 10 has three layers, 12, 14, and 16. First layer 12 of non-conductive layer structure 10 is an oxide layer fabricated by chemical vapor deposition (CVD). The preferred thickness of this first layer 12 is about 3000 Angstroms. Second layer 14 of non-conductive layer structure 10, is preferably fabricated, by way of an example, out of spin-on-glass (SOG) to a thickness of approximately on the order of 2500 Angstroms. Other thicknesses are workable as well. For example, the range of thicknesses of about 1000-3500 angstroms can be effective for the SOG layer and workable in connection with the invention. The third layer 16 of non-conductive layer structure 10 is again chemical vapor deposition (CVD) oxide, as is first layer 12, completing the structure of non-conductive layer structure 10, which may be referred to as the interlayer dielectric (ILD) layer. The composite non-conductive layer structure 10 is on the order of one micron thick.

Figure 1:
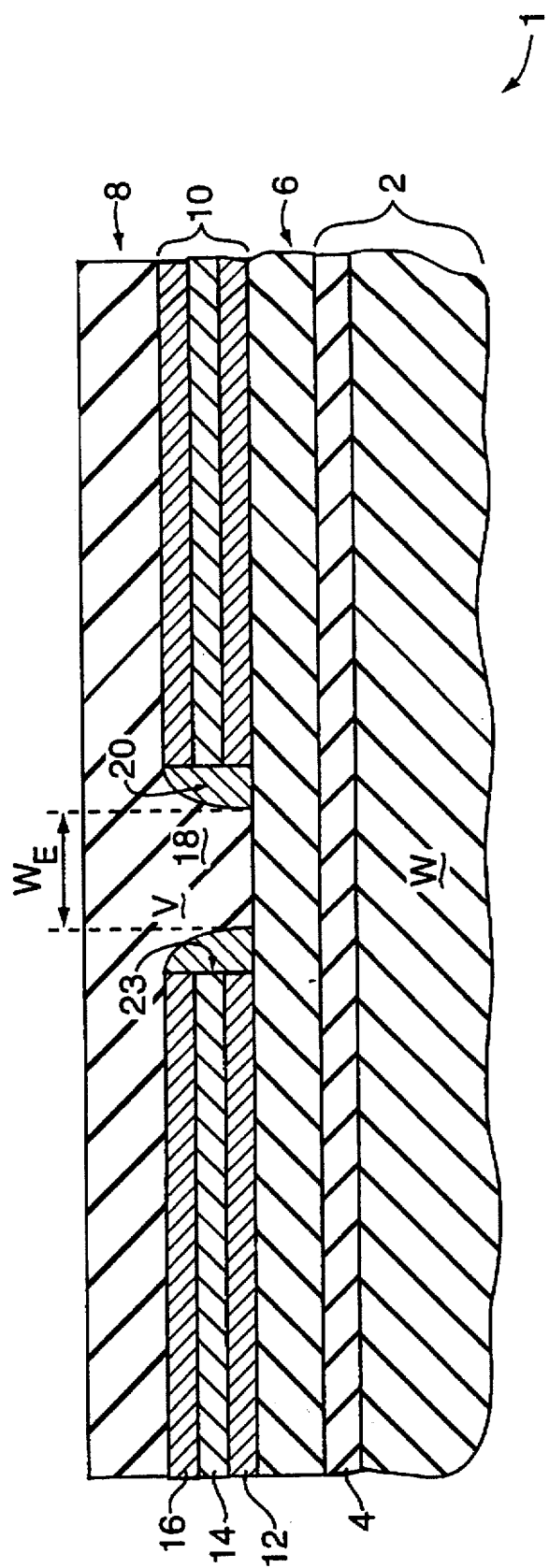
FIG. 1 shows, in partial cross section, a prior approach for interconnecting two conductive layers in a semiconductor structure.

FIG. 2a illustrates an aperture 18 defined in non-conductive layer structure 10. For convenience, this aperture will be referred to herein as via aperture 18 having aperture walls 23. In particular, via aperture 18 is defined at a selected location in non-conductive layer structure 10 and extends at the selected location through successive layers, 12, 14, and 16 in non-conductive layer structure 10, thereby partially exposing conductive layer 6 to further deposition action from above. Via aperture 18 is preferably established by plasma etching through the various layers of non-conductive layer structure 10 including the spin-on glass (SOG) of the second layer 14 of non-conductive layer structure 10 by techniques well known to those skilled in the art. As shown with reference to FIG. 1, conductive layer 6 of semiconductor structure 10 is deposited on substrate 2.

Figure 2B:
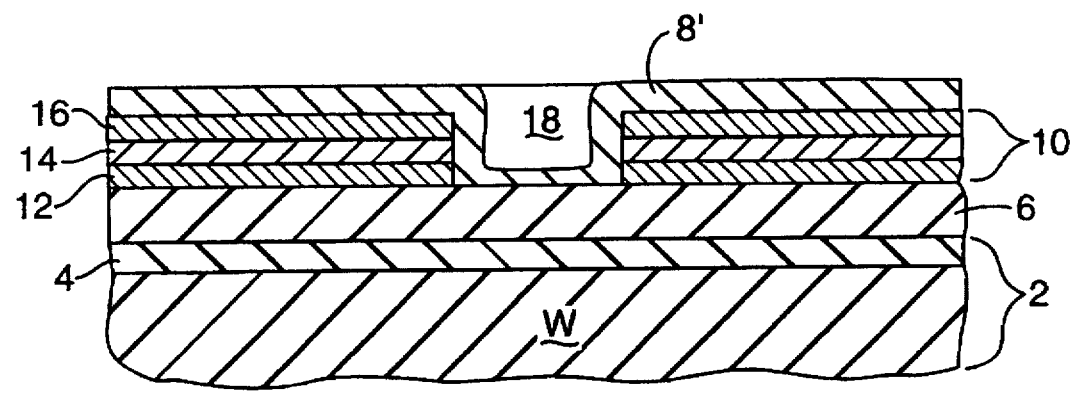
FIG. 2b shows, in partial cross section, the basic semiconductor structure set forth in FIG. 2a, further including a titanium tungsten layer deposited thereover and within the via aperture.

FIG. 2b shows semiconductor structure 1 of FIG. 2a further including a titanium tungsten layer 8' deposited over non-conductive layer structure 10 of semiconductor structure 1. As one preferred embodiment, the titanium tungsten layer 8' is sputter deposited over the entire surface of non-conductive layer structure 10 and into via aperture 18.

With deposition of titanium tungsten layer 8' into via aperture 18, the layer 8' adapts substantially conformably to the layer drop of via aperture 18. The preferred thickness of titanium tungsten which is sputter deposited is approximately two to five thousand Angstroms.

Titanium tungsten (TiW) is a preferred metal for layer 8', because it is a good conductor, has excellent step coverage, is a high density metal, and because it is relatively benign with respect to the typically aluminum layer which is ultimately deposited over it. Aluminum would not be as good a material for layer 8, because of poor step coverage and because it is a light metal which is not effective for sealing the edges of SOG layer 14 and oxide layers 12 and 16. However, other suitable metals for layer 8' are refractory metals such as Titanium, Tungsten and Platinum, which have similar attributes as TiW.

Figure 2C:
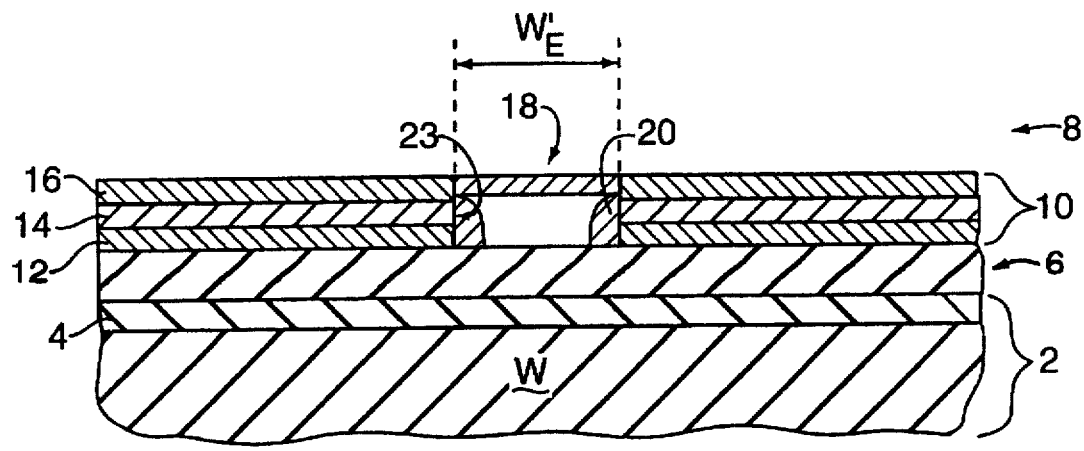
FIG. 2c shows, in partial cross section, the basic semiconductor structure of FIG. 2b in which substantial portions of the titanium tungsten layer have been removed, leaving a conductive TiW spacer within the via aperture.

FIG. 2c shows semiconductor structure 1 in partial cross section, reflecting semiconductor structure 1 of FIG. 2b. In FIG. 2c substantial portions of titanium tungsten layer 8' have been removed by an etching operation, leaving TiW spacer 20 abutting against and sealing the edges of non-conductive layer structure 10, surrounding aperture 18. This etching step is preferably an anisotropic dry etch (such as a plasma etch) as is well known to those skilled in the art.

As seen in FIG. 2c, TiW spacer 20 is effective to secure the aperture walls 23 of via aperture 18 and to prevent undesired out-gassing effects from SOG layer 14 of non-conductive layer structure 10. Because TiW spacer 20 is electrically conductive, the effective width of via aperture 16 for purposes of passage of electric current is "$W_E'$", i.e. the full width of the aperture 18. This is wider than the reduced effective width, "$W_E$," which is found in the prior art when the edges of non-conductive layer structure 10 in via aperture 18 are secured with the dielectric spacer 20 of FIG. 1. The result, according to the invention, is reduced via resistance without a cost in terms of additional geography which might otherwise need to be allocated to accomplish that purpose.

Figure 2D:
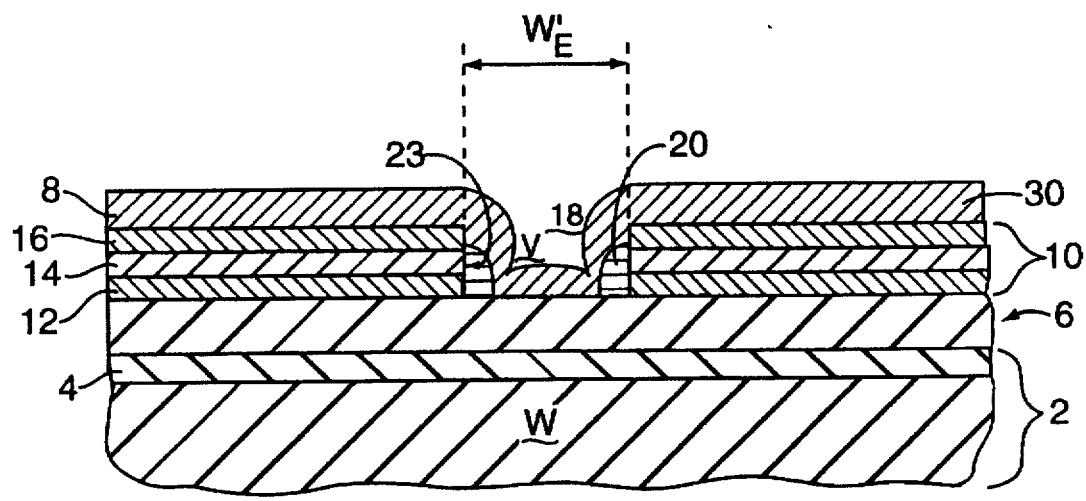
FIG. 2d shows, in partial cross section, the semiconductor structure of FIG. 2c, in which a second conductive layer has been fabricated over the substrate, the first conductive layer, and the non-conductive layer, the TiW spacer and within the via aperture.

FIG. 2d shows, in partial cross section, semiconductor structure 1 of FIG. 2c, in which a second conductive layer 30 has been fabricated over non-conductive layer structure 10, TiW spacer 20, and within via aperture 18. Conductive layer 30 can be deposited by a number of processes. As one preferred embodiment, conductive layer 30 is deposited by a first sputter deposition of titanium tungsten followed by the sputter deposition of aluminum or AlCu. Finally, a sputter deposition of titanium tungsten is again applied. The conductive layer 30 is then patterned into conductive lines, by techniques well known to those skilled in the art.

Figure 3:
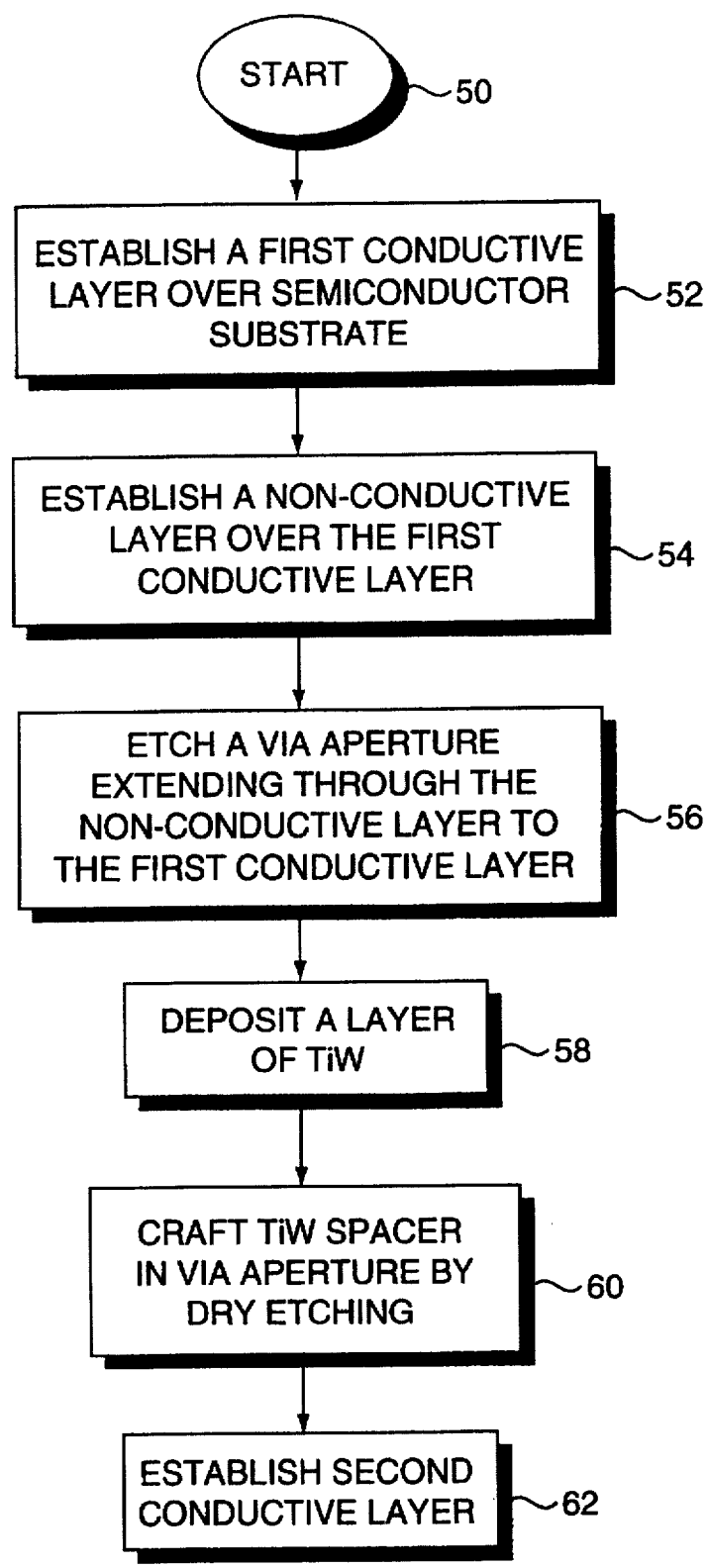
FIG. 3 is a flow chart indicating a fabrication process according to the invention herein.

FIG. 3 is a flow chart illustrating the fabrication process according to the invention herein. By way of summary, it is shown that according to the invention, the process of fabrication of the semiconductor structure 1 including a titanium tungsten spacer 20 to maintain the via aperture dimension undiminished, begins or starts at step 50. As a first step 52, first conductive layer 6 is deposited over substrate 2. As a next step 54, a non-conductive layer structure 10 is deposited over first conductive layer 6. According to step 56, a via aperture 18 is defined extending through non-conductive layer structure 10. Next, in accordance with step 58, a layer of titanium tungsten (TiW) is deposited over non-conductive layer structure 10 and within via aperture 18. Spacer 20 is next defined according to step 60, by anisotropically etching away the TiW layer 8' except for the portion thereof defining the spacer 20. Finally, a second conductive layer 30 is deposited over the non-conductive layer structure 10, spacer 20, and within aperture 18. As noted, this results in a more advantageous effective conductive via width, "$W_E'$," of a conductive via V without sacrificing additional chip real estate.

While this invention has been described in terms of several preferred embodiments, it is contemplated that many alterations, permutations, and equivalents will be apparent to those skilled in the art. It is therefore intended that the following appended claims be interpreted as including all such alterations, permutations, and equivalents as fall within the true spirit and scope of the present invention.

What is claimed is:

1. A method for making an electrical interconnection between two conductive layers in a semiconductor structure, including the steps of:

(a) providing a first conductive layer on a semiconductor substrate;

(b) providing a non-conductive layer including a spin-on-glass (SOG) layer, upon said first layer of conductive material;

(c) creating an aperture extending through said non-conductive layer, said aperture having aperture walls in said non-conductive layer and defining an aperture width, said aperture exposing a portion of said first conductive layer;

(d) depositing a conductive layer having a thickness ranging from between about 2500 Angstroms and about 5000 Angstroms and processing said conductive layer to create tapered metallic conductive spacers within said aperture in abutment against said aperture walls and co-extensive therewith, said tapered conductive spacers being in electrical contact with said fast conductive layer, and (e) providing a substantially continuous second conductive layer over said non-conductive layer and within said aperture to provide electrical contact with said tapered conductive spacers and said fast conductive layer to provide thereby an effective width for the passage of electric current between said first conductive layer and said second conductive layer that is substantially equal to the effective width of said aperture;

wherein said tapered conductive spacers are effective to reduce outgassing from said spin-on-glass layer.

2. A method for permitting the establishment of an electrical interconnection between selected conductive layers in a semiconductor structure, including the steps of:

(a) providing a first layer of conductive material on a semiconductor substrate;

(b) providing a non-conductive layer structure of a dielectric material including a spin-on-glass (SOG) layer, upon said first layer of conductive material;

(c) creating an aperture having aperture walls defining lateral dimensions at a location in said non-conductive layer structure, said aperture exposing a portion of said first layer of conductive material and defining a path through said non-conductive layer structure.

(d) depositing a layer of titanium tungsten having a thickness ranging from between about 2500 Angstroms and about 5000 Angstroms upon said non-conductive layer structure and within said aperture;

(e) removing portions of the layer of titanium tungsten to establish conductive tapered titanium tungsten spacers for securing said aperture walls, said conductive tapered titanium tungsten spacers being co-extensive with said aperture walls and in electrical contact with said first layer of conductive material;

(f) providing a substantially continuous second conductive layer over said non-conductive layer and within said aperture to provide electrical contact with said conductive tapered titanium tungsten spacers and said first conductive layer to provide thereby an effective width for the passage of electric current between said first conductive layer and said second conductive layer that is substantially equal to effective width of said aperture; and wherein said tapered conductive spacers are effective to reduce outgassing from said spin-on-glass layer.

3. The method of claim 2, wherein said step of removing portions of the deposited layer of titanium tungsten includes the step of plasma etching.

4. The method of claim 1 wherein said step of creating tapered conductive spacer includes removing portions of said tapered conductive spacers by anisotropic etching.

* * * * *

UNITED STATES PATENT AND TRADEMARK OFFICE
CERTIFICATE OF CORRECTION

PATENT NO. : 5,712,195
DATED : January 27, 1998
INVENTOR(S) : Chang

It is certified that error appears in the above-indentified patent and that said Letters Patent is hereby corrected as shown below:

Column 6, line 35, change "fast" to --first--
Column 6, line 36, change "," to --;--
Column 6, line 40, change "fast" to --first--
Column 6, line 60, change "." to --;--
Column 8, line 2, after "to" insert --the--

Signed and Sealed this

Eleventh Day of January, 2000

Q. TODD DICKINSON

Attest:

Attesting Officer

Acting Commissioner of Patents and Trademarks